United States Patent
Ono et al.

(10) Patent No.: US 9,099,405 B2
(45) Date of Patent: Aug. 4, 2015

(54) DISPLAY DEVICE

(71) Applicant: Kabushiki Kaisha Toshiba, Minato-ku (JP)

(72) Inventors: Tomio Ono, Kanagawa-ken (JP); Keiji Sugi, Kanagawa-ken (JP); Tomoaki Sawabe, Tokyo (JP); Daimotsu Kato, Tokyo (JP); Hayato Kakizoe, Kanagawa-ken (JP); Yasushi Shinjo, Kanagawa-ken (JP); Shintaro Enomoto, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/045,133

(22) Filed: Oct. 3, 2013

(65) Prior Publication Data

US 2014/0138648 A1 May 22, 2014

(30) Foreign Application Priority Data

Nov. 19, 2012 (JP) .................. 2012-253738

(51) Int. Cl.
*H01L 35/24* (2006.01)
*H01L 51/00* (2006.01)
*H01L 27/32* (2006.01)
*G09F 9/33* (2006.01)

(52) U.S. Cl.
CPC .............. *H01L 27/3206* (2013.01); *G09F 9/33* (2013.01)

(58) Field of Classification Search
CPC ..... H01L 35/24; H01L 51/00; H01L 51/0545; H01L 51/0036; H01L 51/0541; H01L 51/5012
USPC ................ 257/40, 89; 313/505, 506
See application file for complete search history.

(56) References Cited

U.S. PATENT DOCUMENTS

| 8,283,858 | B2 | 10/2012 | Yonehara et al. |
| 8,368,129 | B2 | 2/2013 | Ono et al. |
| 8,460,950 | B2 | 6/2013 | Ono et al. |
| 2006/0131566 | A1 | 6/2006 | Liu et al. |
| 2009/0091265 | A1* | 4/2009 | Song et al. ............... 315/185 R |
| 2011/0057180 | A1 | 3/2011 | Ono et al. |
| 2011/0175067 | A1 | 7/2011 | Sugi et al. |
| 2011/0180835 | A1 | 7/2011 | Ono et al. |

(Continued)

FOREIGN PATENT DOCUMENTS

| EP | 1 111 966 A2 | 6/2001 |
| JP | 11-3605 | 1/1999 |

(Continued)

OTHER PUBLICATIONS

Extended European Search Report issued Nov. 24, 2011 in Patent Application No. 13188446.2.

*Primary Examiner* — Phuc Dang
(74) *Attorney, Agent, or Firm* — Oblon, McClelland, Maier & Neustadt, L.L.P.

(57) ABSTRACT

According to one embodiment, a display device, includes: a display unit and a control unit. The display unit has a plurality of segments. Each of the plurality of segments includes a plurality of organic light emitting layers to emit light of mutually different colors. The plurality of segments forms one of a plurality types of images by changing the colors of the emitted light from the plurality of segments. The control unit drives each of the plurality of segments of the display unit to emit light.

21 Claims, 10 Drawing Sheets

(56) References Cited

U.S. PATENT DOCUMENTS

| | | |
|---|---|---|
| 2012/0075278 A1 | 3/2012 | Hara et al. |
| 2012/0206038 A1* | 8/2012 | Hatano .................... 313/505 |
| 2012/0228591 A1 | 9/2012 | Sawabe et al. |
| 2012/0229020 A1 | 9/2012 | Yonehara et al. |
| 2012/0235127 A1 | 9/2012 | Takasu et al. |
| 2012/0241725 A1 | 9/2012 | Sawabe et al. |
| 2012/0241771 A1 | 9/2012 | Kato et al. |
| 2012/0299482 A1 | 11/2012 | Sugi et al. |
| 2013/0069090 A1 | 3/2013 | Sawabe et al. |
| 2013/0182418 A1 | 7/2013 | Sawabe et al. |
| 2013/0248825 A1 | 9/2013 | Sugizaki et al. |
| 2013/0249384 A1 | 9/2013 | Sawabe et al. |
| 2013/0250214 A1 | 9/2013 | Sugi et al. |

FOREIGN PATENT DOCUMENTS

| | | |
|---|---|---|
| JP | 2012-9254 | 1/2012 |
| WO | WO 2008/070372 A1 | 6/2008 |
| WO | WO 2010/005115 A1 | 1/2010 |

* cited by examiner

DISPLAY DEVICE

CROSS-REFERENCE TO RELATED APPLICATIONS

This application is based upon and claims the benefit of priority from Japanese Patent Application No. 2012-253738, filed on Nov. 19, 2012; the entire contents of which are incorporated herein by reference.

FIELD

Embodiments described herein relate generally to a display device.

BACKGROUND

There is a display device that includes an organic light emitting diode (OLED). In such a display device, only one predetermined image can be displayed.

Therefore, it is desirable to develop a display device that can selectively display multiple predetermined images.

BRIEF DESCRIPTION OF THE DRAWINGS

FIGS. 2A and 2B are schematic views showing a configuration of a region 12a;

DETAILED DESCRIPTION

Figure 1A:
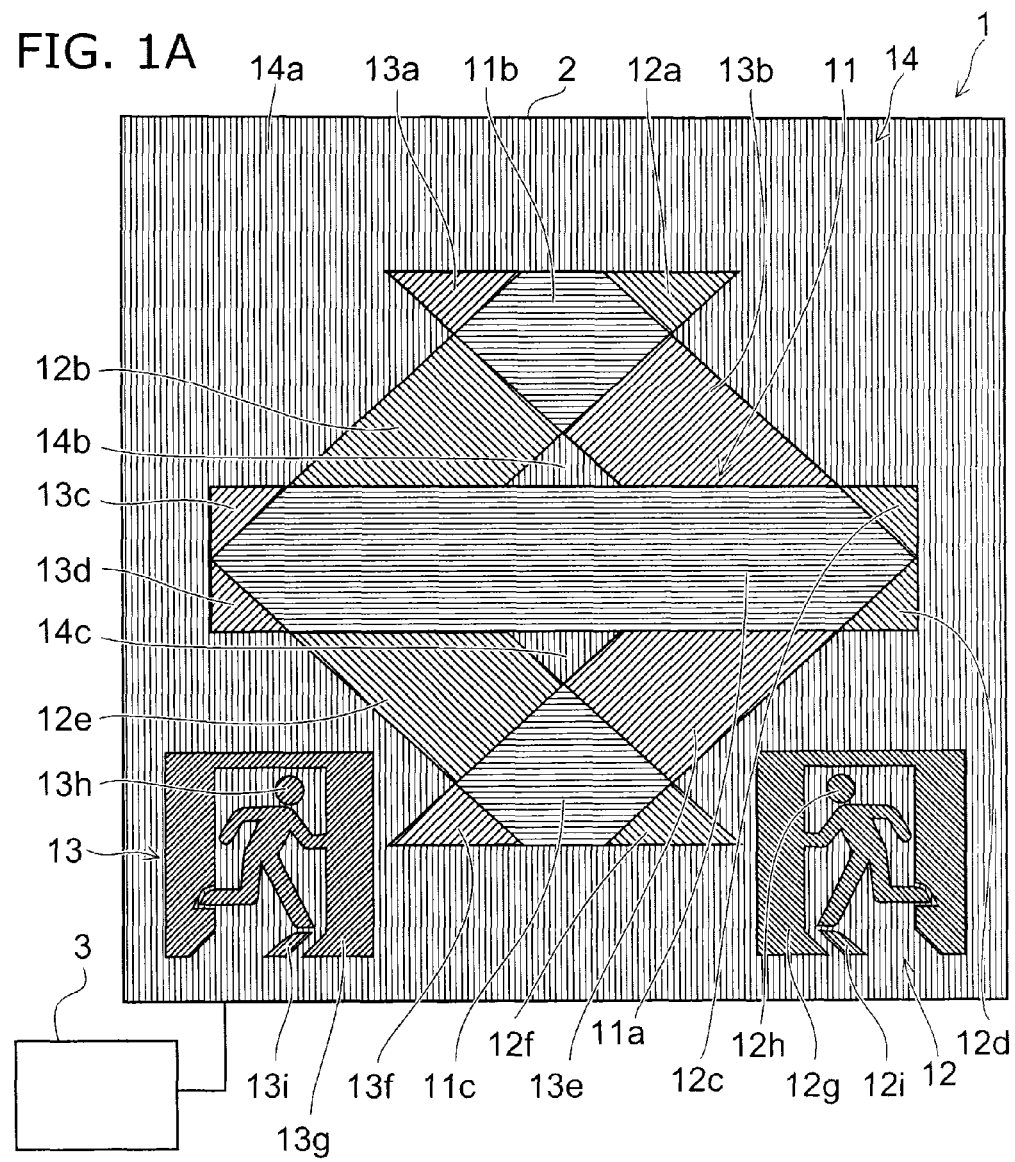
FIGS. 1A to 1C are schematic views showing a display device 1 according to a first embodiment.

In general, according to one embodiment, a display device, includes: a display unit and a control unit. The display unit hays a plurality of segments. Each of the plurality of segments includes a plurality of organic light emitting layers to emit light of mutually different colors. The plurality of segments forms one of a plurality types of images by changing the colors of the emitted light from the plurality of segments. The control unit drives each of the plurality of segments of the display unit to emit light.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

The display device according to the embodiment of the invention may be a device such as, for example, an illuminated emergency exit sign, a traffic sign, etc., that is used to display predetermined images.

Hereinbelow, a display device used in an illuminated emergency exit sign is described as an example.

First Embodiment

Figure 1B:
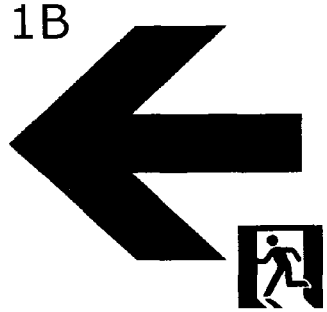
Figure 1C:
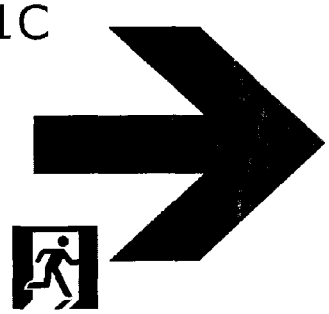

FIGS. 1A to 1C are schematic views showing a display device 1 according to the first embodiment.

FIG. 1A is a schematic view showing the configuration of the display device 1. FIGS. 1B and 1C are schematic views showing the images displayed by the display device 1.

As shown in FIG. 1A, a display unit 2 and a control unit 3 are provided in the display device 1.

A segment 11, a segment 12, a segment 13, and a segment 14 are provided in the display unit 2 as multiple segments that form multiple predetermined images.

The segment 11, the segment 12, the segment 13, and the segment 14 are made of multiple regions that are separated in the plane; and the color of the synchronously emitted light changes for the multiple regions belonging to the same segment. For example, the segment 11 is made of regions 11a to 11c; the segment 12 is made of regions 12a to 12i; the segment 13 is made of regions 13a to 13i; and the segment 14 is made of regions 14a to 14c.

The control unit 3 causes the display unit 2 to selectively display multiple images by selecting the color of the emitted light for the segment 11, the segment 12, the segment 13, and the segment 14.

For example, the segment 11, the segment 12, the segment 13, and the segment 14 may include a light emitting unit 110 and a light emitting unit 120 that are multiply provided to be arranged alternately in a direction parallel to the display surface, where the light emitting unit 110 has a line configuration and emits white light L1, and the light emitting unit 120 has a line configuration and emits green light L2.

Only one selected from the light emitting unit 110 and the light emitting unit 120 may be provided in segments that are common to the multiple images displayed by the display unit 2. For example, only the light emitting unit 120 may be provided in the segment 11; and only the light emitting unit 110 may be provided in the segment 14.

In such a case, the light emitting unit 110 having the line configuration may include an organic light emitting layer 24b (corresponding to an example of a first organic light emitting layer) that emits the white light L1.

The light emitting unit 120 having the line configuration may include an organic light emitting layer 24a (corresponding to an example of a second organic light emitting layer) that emits the green light L2.

Then, by selecting the color of the light emitted from at least one selected from the organic light emitting layer 24b and the organic light emitting layer 24a of each of the segments, light of multiple colors can be caused to be selectively emitted for each of the segments. Therefore, the multiple predetermined images can be selectively displayed by the display unit 2.

For example, as shown in Table 1 recited below, the image shown in FIG. 1B and the image shown in FIG. 1C can be selectively displayed by the display unit 2 by selecting the color of the light emitted from the organic light emitting layer 24a or the organic light emitting layer 24b of each of the segments.

TABLE 1

| | IMAGE SHOWN IN FIG. 1B | IMAGE SHOWN IN FIG. 1C |
|---|---|---|
| SEGMENT 11 | ORGANIC LIGHT EMITTING LAYER 24a (GREEN LIGHT) | ORGANIC LIGHT EMITTING LAYER 24a (GREEN LIGHT) |
| SEGMENT 12 | ORGANIC LIGHT EMITTING LAYER 24a (GREEN LIGHT) | ORGANIC LIGHT EMITTING LAYER 24b (WHITE LIGHT) |
| SEGMENT 13 | ORGANIC LIGHT EMITTING LAYER 24b (WHITE LIGHT) | ORGANIC LIGHT EMITTING LAYER 24a (GREEN LIGHT) |
| SEGMENT 14 | ORGANIC LIGHT EMITTING LAYER 24b (WHITE LIGHT) | ORGANIC LIGHT EMITTING LAYER 24b (WHITE LIGHT) |

Although two types of images are selectively displayed by switching between the two types of colors of light for each of the segments in the description recited above, this is not limited thereto. For example, it is sufficient to prepare $2^n$ segments in the case where n types of images are selectively displayed by switching between the two types of colors of light. The case shown in FIGS. 1A to 1C is a case where n=2 and the number of the segments is 4. Here, n is a positive integer.

The regions of the segments will now be described further.

Although the configuration of the region 12a of the segment 12 is described hereinbelow, this is similar for the configurations of the other regions.

Figure 2A:
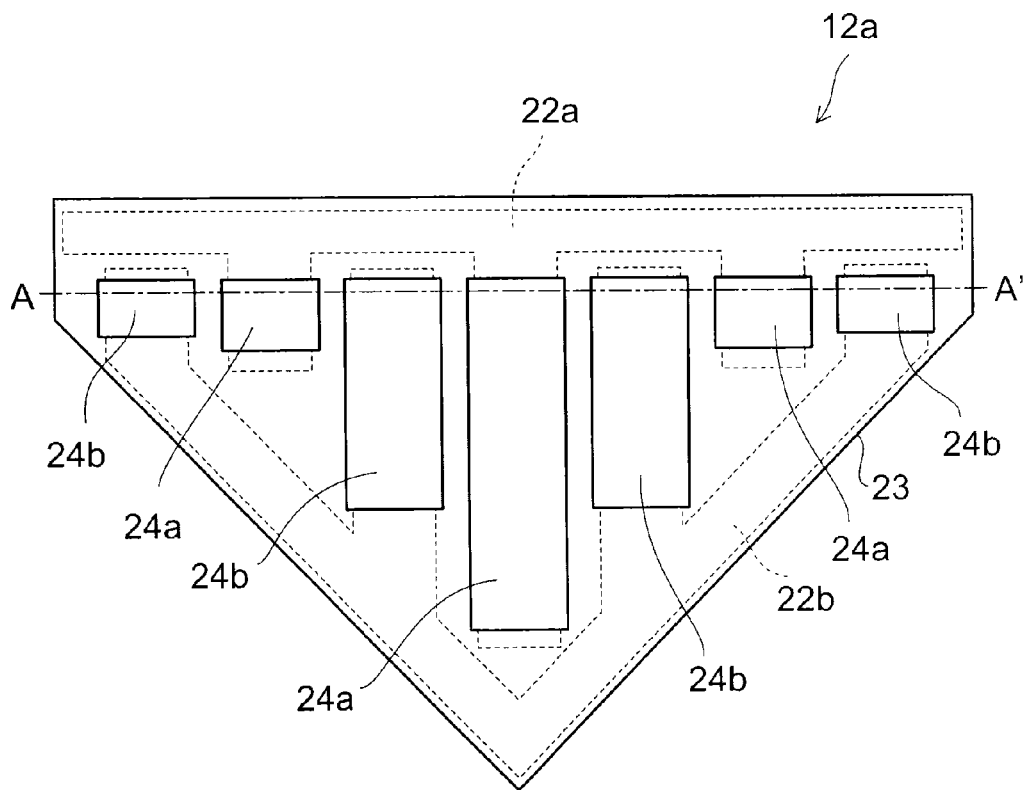
Figure 2B:
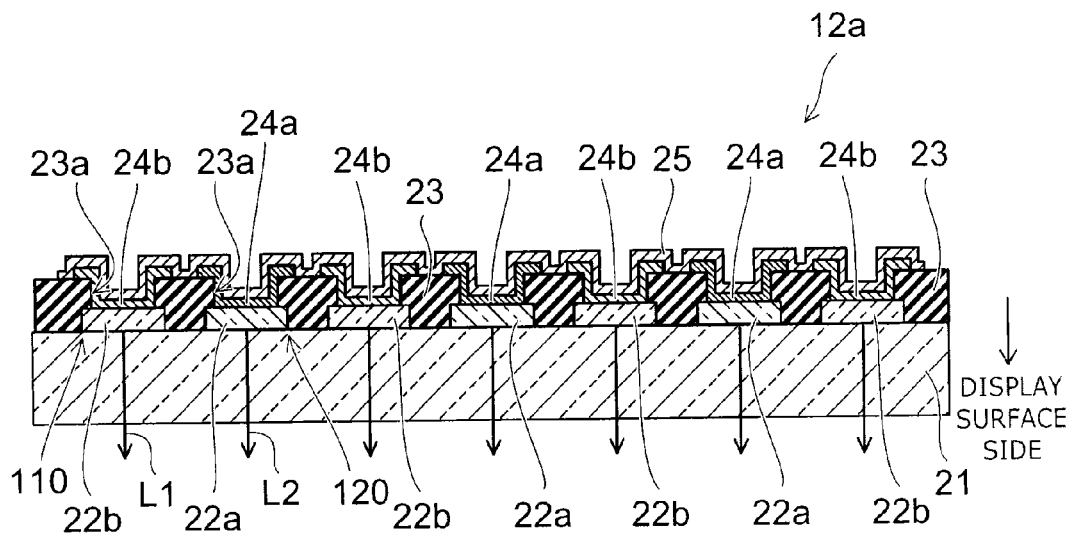

FIGS. 2A and 2B are schematic views showing the configuration of the region 12a.

FIG. 2A is a schematic plan view showing the configuration of the region 12a. FIG. 2B is a cross-sectional view along line A-A' of FIG. 2A.

An electrode 25 is not shown in FIG. 2A.

As shown in FIGS. 2A and 2B, a substrate 21, the light emitting unit 110, the light emitting unit 120, and an insulating unit 23 are provided in the region 12a.

The substrate 21 has a plate configuration; and the light emitting unit 110, the light emitting unit 120, and the insulating unit 23 are provided at one surface of the substrate 21. The surface of the substrate 21 on the side opposite to the side on which the light emitting unit 110, etc., are provided is the surface on the side where the white light L1 and the green light L2 are emitted (the surface on the display side of the display unit 2).

The substrate 21 is transmissive to the light L1 and the light L2 emitted from the light emitting unit 110 and the light emitting unit 120. The material of the substrate 21 may include, for example, transparent glass such as quartz glass, alkali glass, alkali-free glass, etc. The material of the substrate 21 may include, for example, a transparent resin such as polyethylene terephthalate, polycarbonate, polymethyl methacrylate, polypropylene, polyethylene, amorphous polyolefin, a fluoric resin, etc.

The light emitting unit 110 includes a transparent electrode 22b, the organic light emitting layer 24b, and the electrode 25.

The light emitting unit 120 includes a transparent electrode 22a, the organic light emitting layer 24a, and the electrode 25.

The transparent electrode 22a and the transparent electrode 22b are provided at one surface of the substrate 21. The transparent electrode 22a and the transparent electrode 22b have line configurations and are multiply provided alternately. Portions of the multiple transparent electrodes 22a at one end are electrically connected to each other. Portions of the multiple transparent electrodes 22b at one end are electrically connected to each other. The transparent electrode 22a and the transparent electrode 22b function as, for example, anodes.

The transparent electrode 22a and the transparent electrode 22b are transmissive to the white light L1 emitted from the light emitting unit 110 and the green light L2 emitted from the light emitting unit 120. The materials of the transparent electrode 22a and the transparent electrode 22b may include, for example, an oxide including an element of at least one species selected from the group consisting of In, Sn, Zn, and Ti. The materials of the transparent electrode 22a and the transparent electrode 22b may include, for example, indium oxide, zinc oxide, tin oxide, indium tin oxide (ITO), and fluorine doped tin oxide (FTO), an electrically conductive glass including indium zinc oxide (e.g., NESA or the like), etc.

The organic light emitting layer 24a is provided between the transparent electrode 22a and the electrode 25.

The thickness dimension of the organic light emitting layer 24a may be, for example, not less than 5 nanometers (nm).

The organic light emitting layer 24a emits the green light L2. The organic light emitting layer 24a may include a mixed material of a host material and a dopant (a green light emitting dopant) that emits the green light L2. The host material of the organic light emitting layer 24a may include, for example, CBP (4,4'-N,N'-bis-dicarbazolylbiphenyl), etc. The green light emitting dopant of the organic light emitting layer 24a may include, for example, Ir(ppy)$_3$(tris(2-phenylpyridine)iridium), etc.

The organic light emitting layer 24b is provided between the transparent electrode 22b and the electrode 25.

The thickness dimension of the organic light emitting layer 24b may be, for example, not less than 5 nanometers (nm).

The organic light emitting layer 24b emits the white light L1. "White light" may be substantially white light or may be white light that is, for example, reddish, yellowish, greenish, bluish, violet-tinted, etc.

The organic light emitting layer 24b may include a mixed material of a host material and dopants that emit green, blue, and red light (a green light emitting dopant, a blue light emitting dopant, and a red light emitting dopant), respectively. For example, CBP and the like are examples of the host material of the organic light emitting layer 24b. For example, Ir(ppy)$_3$ and the like are examples of the green light emitting dopant of the organic light emitting layer 24b. For example, Flrpic (iridium(III)bis(4,6-difluorophenyl)pyridinato-N,C2'-picolinate) and the like are examples of the blue light emitting dopant of the organic light emitting layer 24b. For example, Flr6 (bis(2,4-difluorophenylpyridinato)-tetrakis(1-pyrazolyl)borate-iridium (III)) and the like are examples of the red light emitting dopant of the organic light emitting layer 24b.

The electrode 25 is provided to cover the organic light emitting layer 24a, the organic light emitting layer 24b, and the insulating unit 23.

The electrode 25 is provided to face the transparent electrode 22a and the transparent electrode 22b.

The electrode 25 is reflective to the light emitted from the organic light emitting layer 24a and the organic light emitting layer 24b. The optical reflectance of the electrode 25 is higher than the optical reflectances of the transparent electrode 22a and the transparent electrode 22b. In the specification of the application, the state of having an optical reflectance that is higher than the optical reflectances of the transparent electrode 22a and the transparent electrode 22b is referred to as being reflective.

The electrode 25 functions as, for example, a cathode. The thickness dimension of the electrode 25 may be, for example, not less than 5 nanometers (nm). If the thickness dimension of the electrode 25 is 5 nanometers (nm) or more, a portion of the light emitted from the organic light emitting layer 24a and the organic light emitting layer 24b is reflected; and the current can be supplied effectively to the organic light emitting layer 24a and the organic light emitting layer 24b.

The electrode 25 includes, for example, at least one selected from aluminum and silver. For example, the electrode 25 includes aluminum. An alloy of silver and magnesium may be used as the electrode 25.

If necessary, the light emitting unit 110 and the light emitting unit 120 may further include a not-shown first functional layer and a not-shown second functional layer.

The not-shown first functional layer is provided between the organic light emitting layer 24a and the transparent electrode 22a and between the organic light emitting layer 24b and the transparent electrode 22b.

The thickness dimension of the first functional layer is, for example, not less than 1 nanometer (nm) and not more than 500 nanometers (nm).

The first functional layer may function as, for example, a hole injection layer. In the case where the first functional layer functions as the hole injection layer, the first functional layer includes, for example, PEDPOT: PPS poly(3,4-ethylenedioxythiophene)-poly(styrenesulfonic acid), CuPc (copper phthalocyanine), $MoO_3$ (molybdenum trioxide), etc.

The first functional layer may function as, for example, a hole transport layer. In the case where the first functional layer functions as the hole transport layer, the first functional layer includes, for example, α-NPD (4,4'-bis[N-(1-naphthyl)-N-phenylamino]biphenyl), TAPC (1,1-bis[4-N,N-di(p-tolyl)amino]phenyl]cyclohexane), m-MTDATA (4,4',4"-tris[phenyl(m-tolyl)amino]triphenylamine), TPD (bis(3-methylphenyl)-N,N'-diphenylbenzidine), TCTA (4,4',4"-tri(N-carbazolyl)triphenylamine), etc.

The first functional layer may include a layer that functions as a hole injection layer stacked with a layer that functions as a hole transport layer. In such a case, the layer that functions as the hole injection layer improves the injection characteristics of the holes. The layer that functions as the hole injection layer is provided between the transparent electrode 22a and the layer that functions as the hole transport layer or between the transparent electrode 22b and the layer that functions as the hole transport layer.

The not-shown second functional layer is provided between the organic light emitting layer 24a and the electrode 25 and between the organic light emitting layer 24b and the electrode 25. The thickness dimension of the second functional layer may be, for example, not less than 1 nanometer (nm) and not more than 500 nanometers (nm).

The second functional layer may function as, for example, an electron transport layer. The second functional layer includes, for example, Alq3 (tris(8-hydroxyquinolinolato)aluminum), BAlq (bis(2-methyl-8-quinolinolato-N1,O8)-(1,1'-biphenyl-4-olato)aluminum), BPhen (batho-phenanthroline), 3TPYMB (tris[3-(3-pyridyl)-mesityl]borane), etc.

The second functional layer may function as, for example, an electron injection layer. In such a case, the second functional layer includes, for example, lithium fluoride, cesium fluoride, lithium quinoline complex, etc.

The second functional layer may include a layer that functions as an electron transport layer stacked with a layer that functions as an electron injection layer. In such a case, the layer that functions as the electron injection layer improves the injection characteristics of the electrons. The layer that functions as the electron injection layer is provided between the electrode 25 and the layer that functions as the electron transport layer.

The insulating unit 23 is provided to cover the substrate 21, the transparent electrode 22a, and the transparent electrode 22b. Holes 23a that pierce the insulating unit 23 are provided above the transparent electrode 22a and the transparent electrode 22b. The transparent electrode 22a and the transparent electrode 22b are exposed from the holes 23a. The organic light emitting layer 24a is provided on the transparent electrode 22a that is exposed from the hole 23a. The organic light emitting layer 24b is provided on the transparent electrode 22b that is exposed from the hole 23a.

The insulating unit 23 is formed from a material that is insulative. As long as the material of the insulating unit 23 is insulative, the material of the insulating unit 23 is not particularly limited. The material of the insulating unit 23 may be, for example, an inorganic material such as silicon oxide, an organic material such as a resin, etc.

Effects of the display device 1 will now be described.

To cause the display unit 2 to selectively display the multiple predetermined images, the control unit 3 selects the color of the emitted light for the segment 11, the segment 12, the segment 13, and the segment 14 and controls the color of the light that is selected to be emitted.

The case will now be described where light of two colors is selectively emitted from the region 12a. This is similar for the case where light of two colors is selectively emitted from the other regions.

In the region 12a as shown in FIGS. 2A and 2B, the transparent electrode 22b of the light emitting unit 110 is electrically independent from the transparent electrode 22a of the light emitting unit 120. Therefore, a voltage is applied between the transparent electrode 22b and the electrode 25 to emit the white light L1 from the light emitting unit 110. The application of the voltage between the transparent electrode 22b and the electrode 25 is stopped to stop the emission of the white light L1 from the light emitting unit 110. A voltage is applied between the transparent electrode 22a and the electrode 25 to emit the green light L2 from the light emitting unit 120. The application of the voltage between the transparent electrode 22a and the electrode 25 is stopped to stop the emission of the green light L2 from the light emitting unit 120.

When the green light L2 and the white light L1 are selectively emitted from the region 12a, it appears that the region 12a uniformly emits green or white light when viewed from afar because the distance between the light emitting units 110 and the distance between the light emitting units 120 are short.

Therefore, by causing the green light L2 and the white light L1 to be selectively emitted from the segment 11, the segment 12, the segment 13, and the segment 14, the multiple predetermined images can be selectively displayed by the display unit 2. In other words, the control unit 3 is capable of switching each of the segments between a first state in which the light is emitted from the organic light emitting layer 24a and a second state in which the light is emitted from the organic light emitting layer 24b.

The configurations of regions according to another embodiment will now be described.

Although the configuration described below is for a region 12a1 that is provided at the same position as the region 12a described above, this is similar for the configurations of the other regions.

Figure 3A:
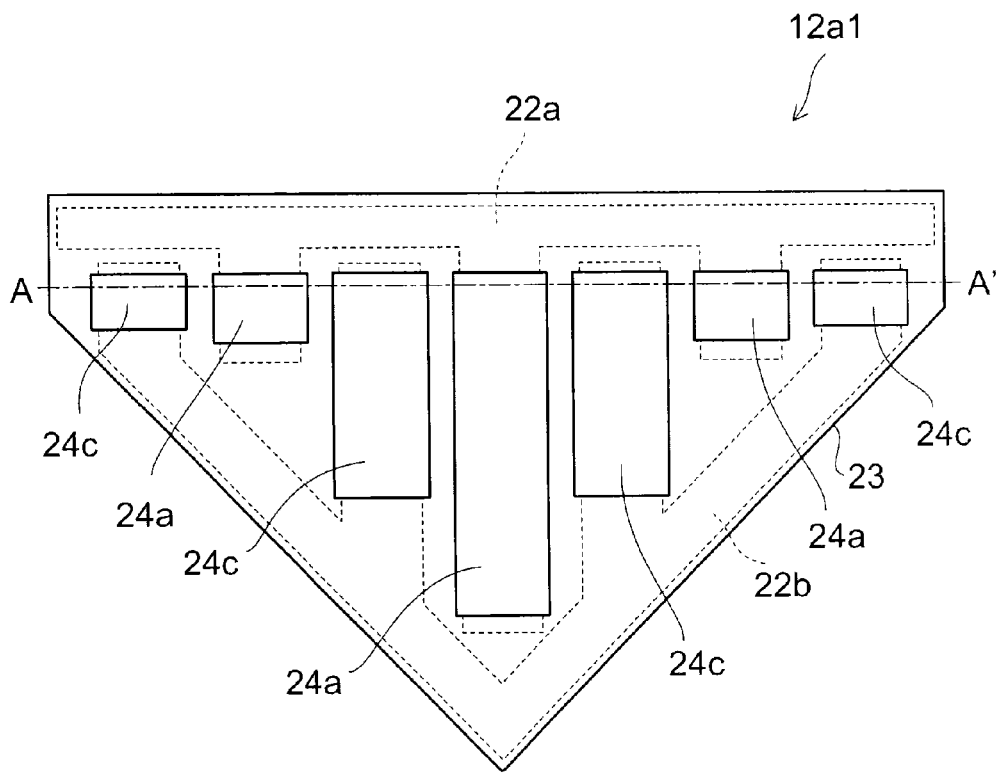
FIGS. 3A and 3B are schematic views showing a configuration of a region 12a1.
Figure 3B:
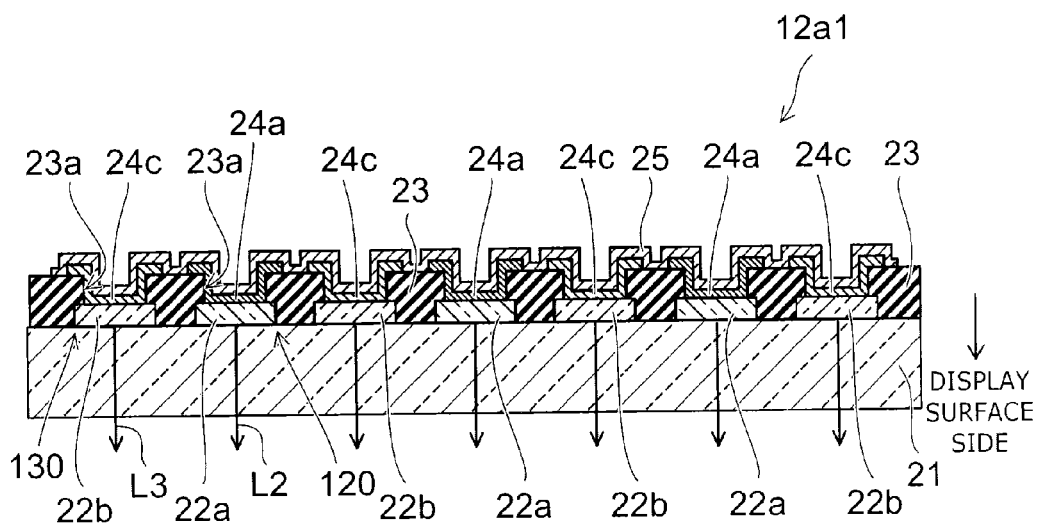

FIGS. 3A and 3B are schematic views showing the configuration of the region 12a1.

FIG. 3A is a schematic plan view showing the configuration of the region 12a1. FIG. 3B is a cross-sectional view along line A-A' of FIG. 3A.

The electrode 25 is not shown in FIG. 3A.

As shown in FIGS. 3A and 3B, the substrate 21, a light emitting unit 130, the light emitting unit 120, and the insulating unit 23 are provided in the region 12a1.

The light emitting unit 130 includes the transparent electrode 22b, an organic light emitting layer 24c (corresponding to an example of the first organic light emitting layer), and the electrode 25.

The organic light emitting layer 24c is provided between the transparent electrode 22b and the electrode 25.

The thickness dimension of the organic light emitting layer 24c may be, for example, not less than 5 nanometers (nm).

The organic light emitting layer 24c emits red light L3.

The organic light emitting layer 24c may include a mixed material of a host material and a dopant (a red light emitting dopant) that emits the red light L3. For example, CBP and the like are examples of the host material of the organic light emitting layer 24c. For example, FIr6 (bis(2,4-difluorophenylpyridinato)-tetrakis(1-pyrazolyl)borate-iridium (III)) and the like are examples of the red light emitting dopant of the organic light emitting layer 24c.

If necessary, the light emitting unit 130 may further include the not-shown first functional layer and the not-shown second functional layer that are described above.

Effects of a display device in which segments having such configurations are provided will now be described.

To cause the display unit 2 to selectively display the multiple predetermined images, the control unit 3 selects the color of the emitted light for each of the segments and controls the color of the light that is selected to be emitted.

In the case described above, light of multiple colors is selectively emitted for each of the segments by switching between the white light L1 from the light emitting unit 110 and the green light L2 from the light emitting unit 120. Conversely, in the embodiment, white light is emitted from the segments by mixing the red light L3 from the light emitting unit 130 and the green light L2 from the light emitting unit 120.

The case where light of two colors is selectively emitted from the region 12a1 will now be described. This is similar for the case where light of two colors is selectively emitted from the other regions.

In the region 12a1 as shown in FIGS. 3A and 3B, the transparent electrode 22b of the light emitting unit 130 is electrically independent from the transparent electrode 22a of the light emitting unit 120. Therefore, a voltage is applied between the transparent electrode 22b and the electrode 25 to emit the red light L3 from the light emitting unit 130. The application of the voltage between the transparent electrode 22b and the electrode 25 is stopped to stop the emission of the red light L3 from the light emitting unit 130. A voltage is applied between the transparent electrode 22a and the electrode 25 to emit the green light L2 from the light emitting unit 120. The application of the voltage between the transparent electrode 22a and the electrode 25 is stopped to stop the emission of the green light L2 from the light emitting unit 120.

The voltages are applied between the transparent electrode 22b and the electrode 25 and between the transparent electrode 22a and the electrode 25 to emit the white light from the region 12a1. Thereby, white light is emitted from the region 12a1 by mixing the red light L3 from the light emitting unit 130 and the green light L2 from the light emitting unit 120. In other words, the control unit 3 is capable of switching each of the segments between the first state in which the light from the organic light emitting layer 24a is emitted and a third state in which light is emitted from both the organic light emitting layer 24a and the organic light emitting layer 24c. The first state may be a state in which the light is emitted from one selected from the organic light emitting layer 24a and the organic light emitting layer 24c.

When the green light L2 is emitted from the region 12a1, the region 12a1 appears to be uniformly emitting green light when viewed from afar because the distance between the light emitting units 120 is short. Also, when the white light is emitted from the region 12a1, the region 12a1 appears to be uniformly emitting white light when viewed from afar because the distance between the light emitting unit 130 and the light emitting unit 120 is short.

Therefore, the multiple predetermined images can be selectively displayed by the display unit 2 by selecting the green light L2 and the white light to be selectively emitted for each of the segments.

In the embodiment, the green light L2 and the white light are selectively emitted for each of the segments by continuously emitting the green light L2 and switching between emitting and not emitting the red light L3 for each of the segments. Therefore, the light emission surface area when the white light is emitted can be greater than that of the case described above. If the light emission surface area can be increased, the life can be extended because the load on the organic light emitting layer 24a and the organic light emitting layer 24c is reduced.

Second Embodiment

Figure 4:
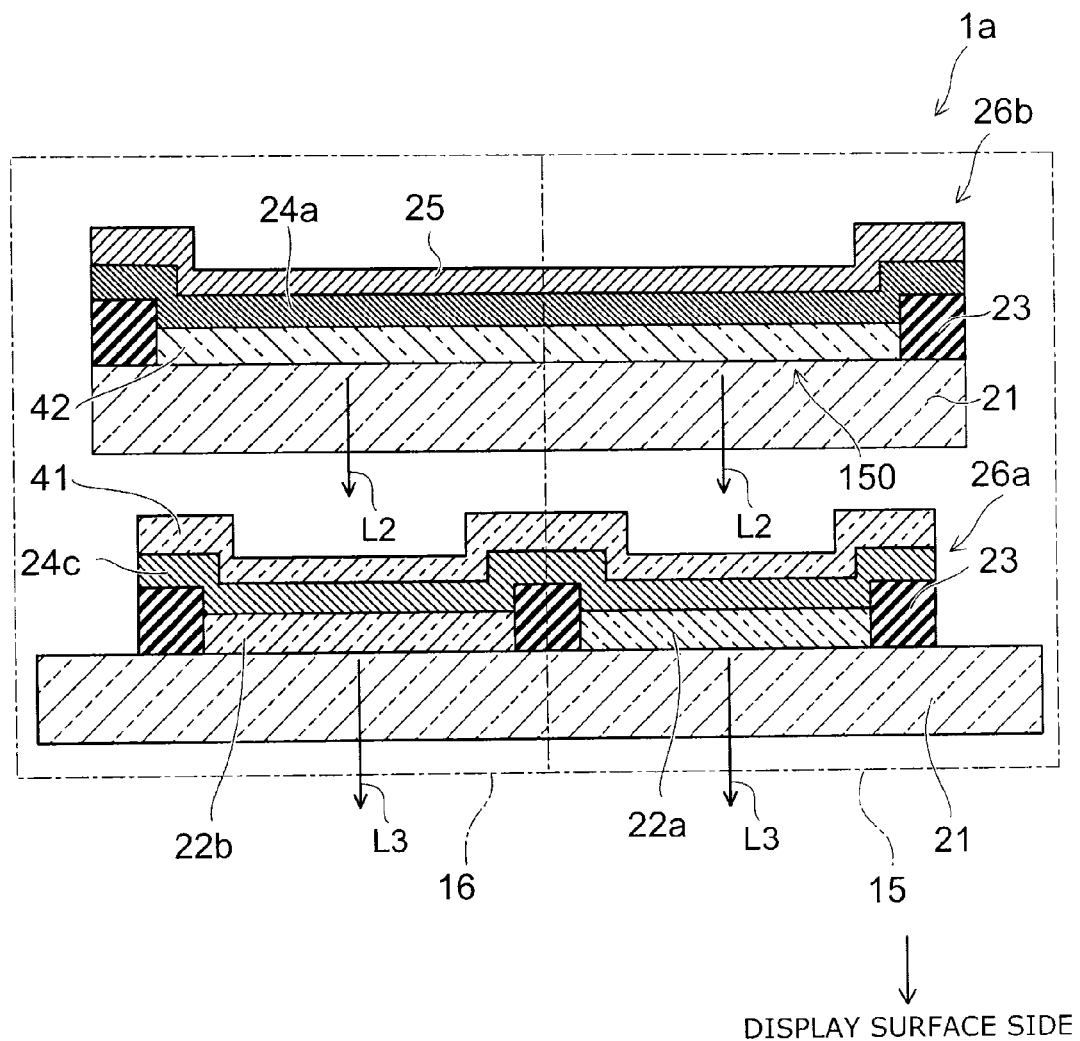
FIG. 4 is a schematic cross-sectional view showing a display device is according to a second embodiment.

FIG. 4 is a schematic cross-sectional view showing a display device 1a according to a second embodiment.

In FIG. 4, two regions 15 and 16 that are provided in the display device is are shown for easier viewing of the drawing. The regions 15 and 16 may be regions of, for example, one selected from the segment 11, the segment 12, the segment 13, and the segment 14 described above.

In the display device is as shown in FIG. 4, a first panel unit 26a and a second panel unit 26b are provided to be stacked. Although the first panel unit 26a shown in FIG. 4 is provided on the display surface side, i.e., the light-emitting side, of the second panel unit 26b, the second panel unit 26b may be provided on the display surface side, i.e., the light-emitting side, of the first panel unit 26a. However, a transparent electrode 41 that is described below is provided in the panel unit that is provided on the display surface side, i.e., the light-emitting side. The first panel unit 26a and the second panel unit 26b may be separated from each other or may be closely adhered.

The region 15 and the region 16 include regions defined by the insulating unit 23.

The portion of the first panel unit 26a corresponding to the region 15 includes the substrate 21, the transparent electrode 22a, the organic light emitting layer 24c (corresponding to an example of the first organic light emitting layer), the transparent electrode 41, and the insulating unit 23.

The portion of the first panel unit 26a corresponding to the region 16 includes the substrate 21, the transparent electrode 22b, the organic light emitting layer 24c, the transparent electrode 41, and the insulating unit 23. If necessary, the portion corresponding to the region 15 and the portion corresponding to the region 16 may further include the not-shown first functional layer and the not-shown second functional layer that are described above.

In other words, the substrate 21, the organic light emitting layer 24c, and the transparent electrode 41 are provided commonly in the portion corresponding to the region 15 and in the portion corresponding to the region 16. The insulating unit 23 is provided at a predetermined position of the outlines of the images. The transparent electrode 22a and the transparent electrode 22b are provided in regions that are defined by the insulating unit 23 and are electrically independent.

The transparent electrode 22a, the transparent electrode 22b, and the organic light emitting layer 24c may be similar to those shown in FIGS. 3A and 3B. However, although the forms of the components shown in FIGS. 3A and 3B have line configurations, the forms of the transparent electrode 22a, the transparent electrode 22b, and the organic light emitting layer 24c according to the embodiment have planar configurations.

The transparent electrode 41 is provided to cover the organic light emitting layer 24c. The transparent electrode 41 functions as, for example, a cathode.

The transparent electrode 41 is transmissive to the green light L2 emitted from the second panel unit 26b. The thickness dimension and/or the material of the transparent electrode 41 may be similar to, for example, those of the transparent electrode 22a and the transparent electrode 22b described above. The material of the transparent electrode 41 may be, for example, a magnesium-silver alloy, etc.

The substrate 21, a light emitting unit 150, and the insulating unit 23 are provided in the second panel unit 26b.

The light emitting unit 150 includes a transparent electrode 42, the organic light emitting layer 24a (corresponding to an example of the second organic light emitting layer), and the electrode 25. If necessary, the light emitting unit 150 may further include the not-shown first functional layer and the not-shown second functional layer that are described above.

The transparent electrode 42 is transmissive to the green light L2 emitted from the organic light emitting layer 24a. The form of the transparent electrode 42 has a planar configuration. The transparent electrode 42 functions as, for example, an anode.

The thickness dimension and/or the material of the transparent electrode 42 may be similar to, for example, those of the transparent electrode 22a and the transparent electrode 22b described above.

The organic light emitting layer 24a may be similar to that shown in FIGS. 3A and 3B. However, although the form of the layer shown in FIGS. 3A and 3B has a line configuration, the form of the organic light emitting layer 24a according to the embodiment has a planar configuration.

The transparent electrode 42 and the organic light emitting layer 24a having planar configurations are provided to cover the portion of the first panel unit 26a corresponding to the region 15 and the portion of the first panel unit 26a corresponding to the region 16 from above. Therefore, the green light L2 emitted from the second panel unit 26b is incident on the portion of the first panel unit 26a corresponding to the region 15 and the portion of the first panel unit 26a corresponding to the region 16.

Effects of the display device 1a will now be described.

To cause the display unit 2 to selectively display the multiple predetermined images, the control unit 3 selects the color of the emitted light for each of the segments and controls the color of the light that is selected to be emitted.

In the embodiment as well, the white light is emitted by mixing the red light L3 and the green light L2.

The voltage is continuously applied between the transparent electrode 42 and the electrode 25 while the display device is displays the images. In other words, the green light L2 is continuously emitted from the second panel unit 26b while the display device is displays the images.

The application of the voltage between the transparent electrode 22a and the transparent electrode 41 and between the transparent electrode 22b and the transparent electrode 41 is stopped to emit the green light L2 from the region 15 and the region 16. Then, the green light L2 can be emitted from the region 15 and the region 16 because the green light L2 that is emitted from the second panel unit 26b passes through the first panel unit 26a.

The voltage is applied between the transparent electrode 22a and the transparent electrode 41 and between the transparent electrode 22b and the transparent electrode 41 to emit the white light from the region 15 and the region 16. Then, because the red light L3 is emitted from the first panel unit 26a, the red light L3 and the green light L2 emitted from the second panel unit 26b become white light by mixing. Therefore, the white light can be emitted from the region 15 and the region 16.

In such a case, the transparent electrode 22a and the transparent electrode 22b are provided in regions that are defined by the insulating unit 23 and are electrically independent. Therefore, the emission of the green light L2 and the emission of the white light can be controlled independently for the region 15 and the region 16.

In the embodiment, the forms of the components of the segments can have planar configurations. For example, the forms of the transparent electrode 22a, the transparent electrode 22b, the organic light emitting layer 24a, the organic light emitting layer 24c, the transparent electrode 41, the transparent electrode 42, etc., can have planar configurations. Therefore, the manufacturing is easier than in the case where the forms of the components of the segments have line configurations.

Third Embodiment

Figure 5:
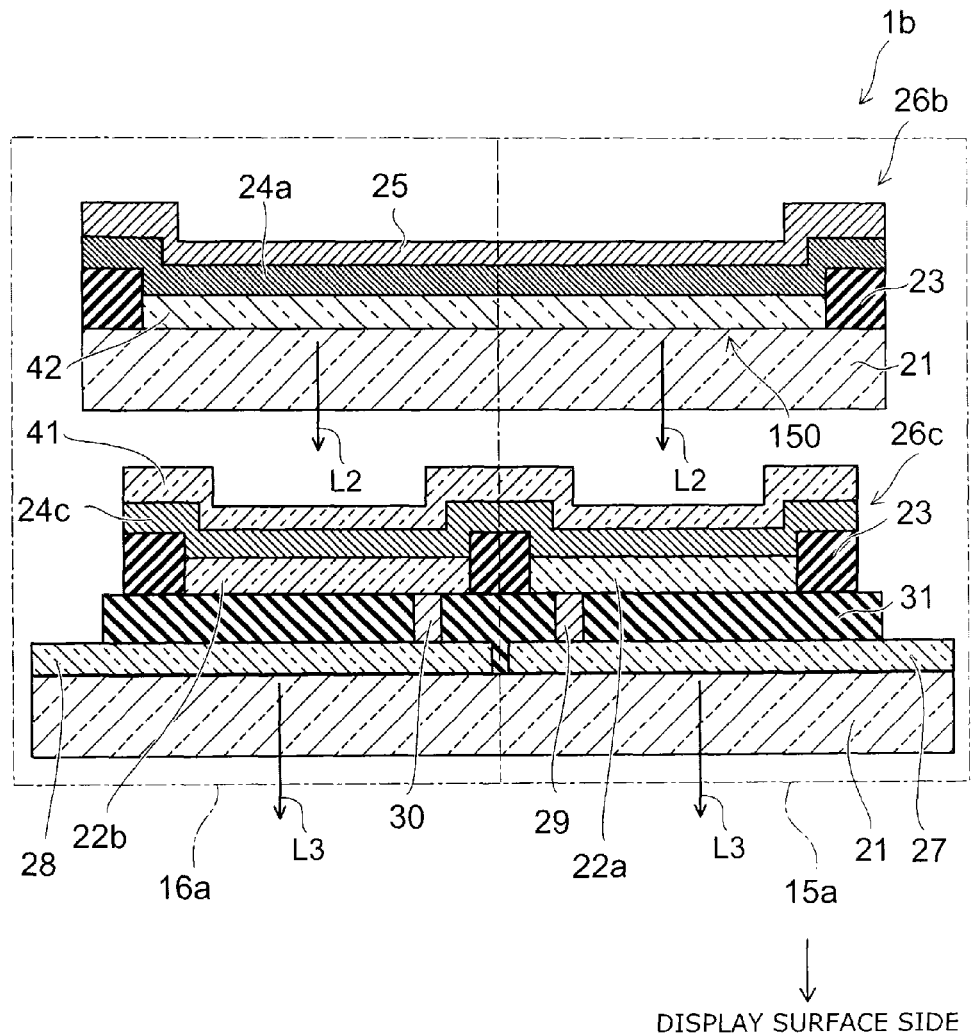
FIG. 5 is a schematic cross-sectional view showing a display device 1b according to a third embodiment.

FIG. 5 is a schematic cross-sectional view showing a display device 1b according to a third embodiment.

In FIG. 5, two regions 15a and 16a that are provided in the display device 1b are shown for easier viewing of the drawing. The regions 15a and 16a may be regions of, for example, one selected from the segment 11, the segment 12, the segment 13, and the segment 14 described above.

In the display device 1b as shown in FIG. 5, a third panel unit 26c and the second panel unit 26b are provided to be stacked. Although the third panel unit 26c shown in FIG. 5 is provided on the display surface side, i.e., the light-emitting side, of the second panel unit 26b, the second panel unit 26b may be provided on the display surface side, i.e., the light-emitting side, of the third panel unit 26c. However, the transparent electrode 41 is provided in the panel unit that is provided on the display surface side, i.e., the light-emitting side. The third panel unit 26c and the second panel unit 26b may be separated from each other or may be closely adhered.

The portions including the regions defined by the insulating unit 23 are the region 15a and the region 16a.

The portion of the third panel unit 26c corresponding to the region 15a includes the substrate 21, the transparent electrode 22a, the organic light emitting layer 24c (corresponding to an example of the first organic light emitting layer), the transparent electrode 41, the insulating unit 23, a transparent interconnect 27, a contact plug 29, and an insulating unit 31. The portion of the third panel unit 26c corresponding to the region 16a includes the substrate 21, the transparent electrode 22b, the organic light emitting layer 24c, the transparent electrode 41, the insulating unit 23, a transparent interconnect 28, a contact plug 30, and the insulating unit 31. If necessary, the portion corresponding to the region 15a and the portion corresponding to the region 16a may further include the not-shown first functional layer and the not-shown second functional layer that are described above.

In other words, the portion corresponding to the region 15a is the portion corresponding to the region 15 described above that further includes the transparent interconnect 27, the contact plug 29, and the insulating unit 31. The portion corresponding to the region 16a is the portion corresponding to the region 16 described above that further includes the transparent interconnect 28, the contact plug 30, and the insulating unit 31. The insulating unit 31 is provided commonly for the portion corresponding to the region 15a and the portion corresponding to the region 16a.

The transparent electrode 22a, the transparent interconnect 27, the contact plug 29, the transparent electrode 22b, the transparent interconnect 28, and the contact plug 30 are electrically independent.

The transparent interconnect 27 is electrically connected to the transparent electrode 22a via the contact plug 29. The transparent interconnect 28 is electrically connected to the transparent electrode 22b via the contact plug 30.

One end portion of the transparent interconnect 27 and one end portion of the transparent interconnect 28 extend outward from the end portion of the insulating unit 31 and are electrically connected to not-shown electrode pads provided at the circumferential edge of the substrate 21. The control unit 3 is electrically connected to the not-shown electrode pads.

The transparent interconnect 27, the transparent interconnect 28, the contact plug 29, and the contact plug 30 are transmissive to the green light L2 emitted from the second panel unit 26b and the red light L3 emitted from the organic light emitting layer 24c. The materials of the transparent interconnect 27, the transparent interconnect 28, the contact plug 29, and the contact plug 30 may be similar to, for example, the transparent electrode 22a and the transparent electrode 22b described above. The thickness dimensions of the transparent interconnect 27 and the transparent interconnect 28 may be similar to, for example, the transparent electrode 22a and the transparent electrode 22b described above.

The insulating unit 31 is provided between the transparent interconnect 27 and the transparent interconnect 28 and the transparent electrode 22a and the transparent electrode 22b.

The insulating unit 31 is transmissive to the green light L2 emitted from the second panel unit 26b and the red light L3 emitted from the organic light emitting layer 24c. As long as the material of the insulating unit 31 is insulative and transmissive to light, the material of the insulating unit 31 is not particularly limited. For example, silicon oxide and the like are examples of the material of the insulating unit 31.

The visibility of the transparent interconnect 27, the transparent interconnect 28, the contact plug 29, the contact plug 30, and the insulating unit 31 from the outside can be suppressed if these components are formed from materials transmissive to light.

Figure 6A:
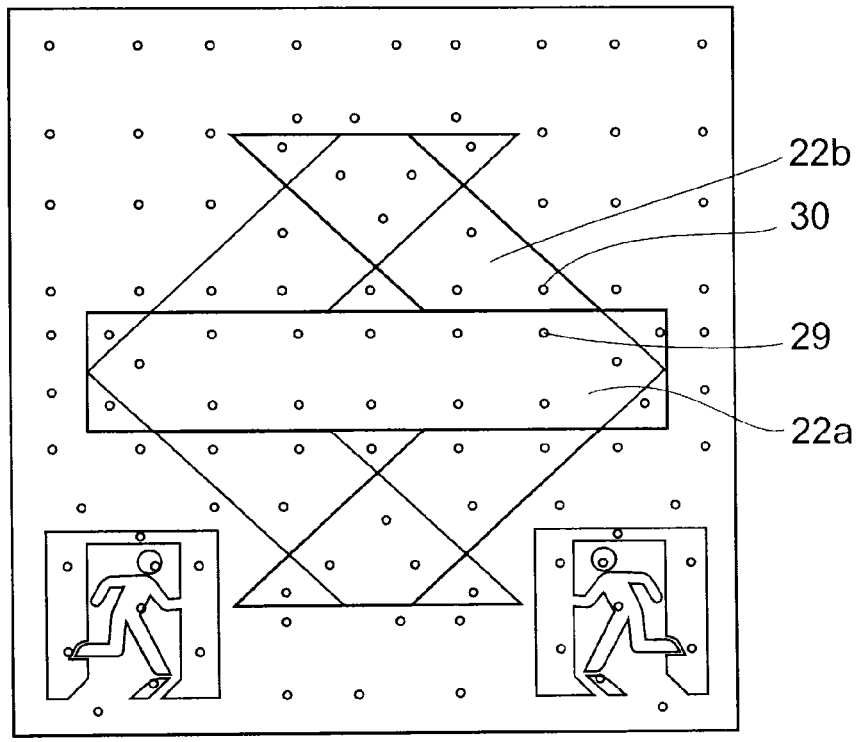
FIGS. 6A and 6B are schematic plan views showing transparent electrodes, contact plugs, and transparent interconnects.
Figure 6B:
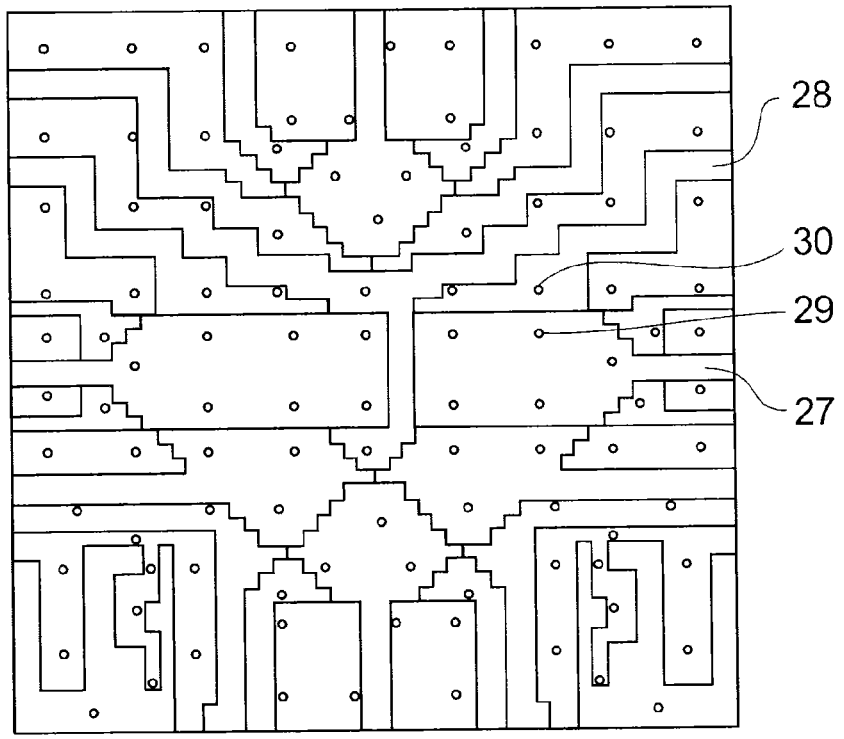

FIGS. 6A and 6B are schematic plan views showing the transparent electrodes, the contact plugs, and the transparent interconnects. FIG. 6A is a schematic plan view showing the transparent electrodes and the contact plugs. FIG. 6B is a schematic plan view showing the contact plugs and the transparent interconnects.

Effects of the display device 1b may be similar to those of the display device 1a shown in FIG. 4.

As shown in FIG. 6A, the transparent electrodes (e.g., the transparent electrode 22a and the transparent electrode 22b) are separated with micro distances between the transparent electrodes. In other words, each of the transparent electrodes is electrically independent.

As shown in FIG. 6B, the transparent interconnects (e.g., the transparent interconnect 27 and the transparent interconnect 28) are separated by micro distances. In other words, each of the transparent interconnects is electrically independent.

Here, as the number of the segments (the number of the types of the images to be displayed) increases, it becomes difficult to electrically connect the transparent electrodes to the electrode pads provided at the circumferential edge of the substrate 21.

In the embodiment, the transparent electrodes are electrically connected to the electrode pads provided at the circumferential edge of the substrate 21 via the contact plugs and the transparent interconnects. Therefore, even in the case where the number of the segments increases, it is easy to electrically connect the transparent electrodes to the electrode pads provided at the circumferential edge of the substrate 21.

Multiple transparent interconnects may be provided in the same layer; or multiple transparent interconnects may be provided separately in stacked layers.

Effects of the display device 1b may be similar to the effects of the display device 1a shown in FIG. 4.

Fourth Embodiment

Figure 7:
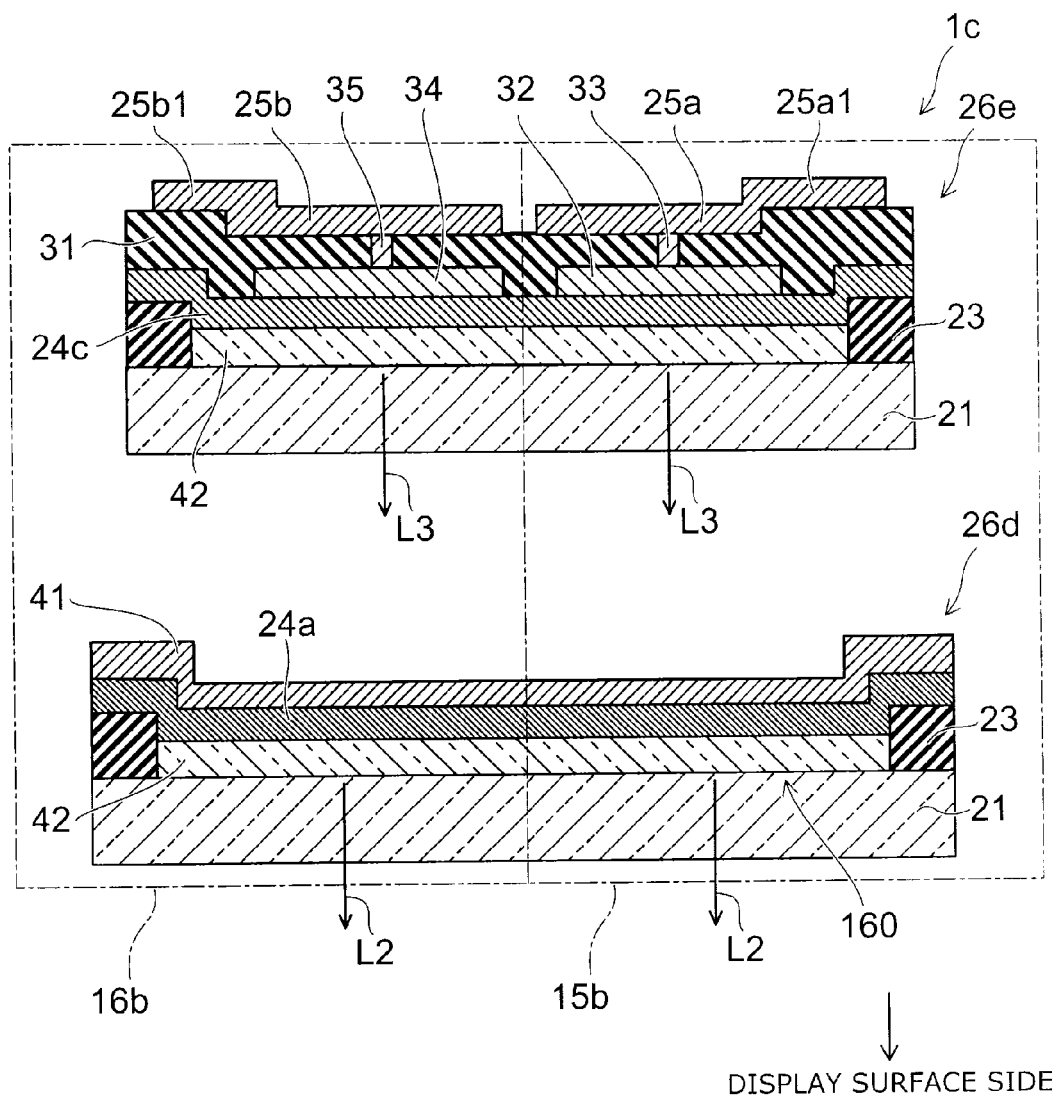
FIG. 7 is a schematic cross-sectional view showing a display device is according to a fourth embodiment.

FIG. 7 is a schematic cross-sectional view showing a display device 1c according to a fourth embodiment.

In FIG. 7, two regions 15b and 16b that are provided in the display device is are shown for easier viewing of the drawing. The regions 15b and 16b may be, for example, regions of one selected from the segment 11, the segment 12, the segment 13, and the segment 14 described above.

In the display device is as shown in FIG. 7, a fourth panel unit 26d and a fifth panel unit 26e are provided to be stacked. The fourth panel unit 26d is provided on the display surface side, i.e., the light-emitting side, of the fifth panel unit 26e. The fourth panel unit 26d and the fifth panel unit 26e may be separated from each other or may be closely adhered.

The portion that includes an electrode 32 described below is the region 15b; and the portion that includes an electrode 34 described below is the region 16b.

The substrate 21, a light emitting unit 160, and the insulating unit 23 are provided in the fourth panel unit 26d. The light emitting unit 160 includes the transparent electrode 42, the organic light emitting layer 24a (corresponding to an example of the first organic light emitting layer), and the transparent electrode 41. If necessary, the light emitting unit 160 may further include the not-shown first functional layer and the not-shown second functional layer that are described above.

In other words, the fourth panel unit 26d is the second panel unit 26b described above in which the electrode 25 is replaced with the transparent electrode 41.

The portion of the fifth panel unit 26e corresponding to the region 15b includes the substrate 21, the transparent electrode 42, the organic light emitting layer 24c (corresponding to an example of the second organic light emitting layer), the electrode 32, a contact plug 33, an electrode 25a, the insulating unit 23, and the insulating unit 31.

The portion of the fifth panel unit 26e corresponding to the region 16b includes the substrate 21, the transparent electrode 42, the organic light emitting layer 24c, the electrode 34, a contact plug 35, an electrode 25b, the insulating unit 23, and the insulating unit 31.

If necessary, the portion corresponding to the region 15b and the portion corresponding to the region 16b may further include the not-shown first functional layer and the not-shown second functional layer that are described above.

In other words, the substrate 21, the transparent electrode 42, the organic light emitting layer 24c, and the insulating unit 31 are provided commonly for the portion corresponding to the region 15b and the portion corresponding to the region 16b. The forms of the transparent electrode 42, the organic light emitting layer 24c, and the organic light emitting layer 24a have planar configurations.

The insulating unit 23 is provided at a predetermined position of the outlines of the images. An electrode pad 25a1 is provided at the end portion of the electrode 25a. An electrode pad 25b1 is provided at the end portion of the electrode 25b.

The electrode 32 and the electrode 25a are electrically connected via the contact plug 33. The electrode 32, the contact plug 33, and the electrode 25a function as cathodes of the region 15b.

The electrode 34 and the electrode 25b are electrically connected via the contact plug 35. The electrode 34, the contact plug 35, and the electrode 25b function as cathodes of the region 16b.

As long as the materials of the electrode 32, the contact plug 33, the electrode 25a, the electrode 34, the contact plug 35, and the electrode 25b are electrically conductive, these materials are not particularly limited. The materials of the electrode 32, the contact plug 33, the electrode 25a, the electrode 34, the contact plug 35, and the electrode 25b may be similar to, for example, the material of the electrode 25 described above.

The insulating unit 31 is provided between the organic light emitting layer 24c and the electrode 25a, between the organic light emitting layer 24c and the electrode 25b, between the electrode 32 and the electrode 25a, and between the electrode 34 and the electrode 25b.

Here, because the insulating unit 31 is provided also on the organic light emitting layer 24c, there is a risk of damaging the organic light emitting layer 24c in the case where the insulating unit 31 is formed by photolithography or sputtering. Therefore, it is favorable to form the insulating unit 31 by a vacuum evaporation method or an electron beam evaporation method.

The material of the insulating unit 31 may be, for example, silicon oxide, etc.

In the embodiment, it is unnecessary to form the electrode 32, the contact plug 33, the electrode 25a, the electrode 34, the contact plug 35, the electrode 25b, and the insulating unit 31 from a transparent material because these components are on the side (the side opposite to the display side) of the display device is from which these components are not easily visible. Therefore, it is possible to form, for example, the electrode 32, the contact plug 33, the electrode 25a, the electrode 34, the contact plug 35, and the electrode 25b from a metal such as aluminum, etc., that has a lower electrical resistance than indium tin oxide. If the electrode 32, the contact plug 33, the electrode 25a, the electrode 34, the contact plug 35, and the electrode 25b are formed from a metal such as aluminum, etc., the fluctuation of the luminance between the segments, etc., can be suppressed because the potential drop can be suppressed.

Effects of the display device 1c will now be described.

In the embodiment as well, white light is emitted by mixing the red light L3 and the green light L2.

The effects of the display device 1c may be similar to those of the display device 1a shown in FIG. 4.

However, in the display device 1c, a voltage is continuously applied between the transparent electrode 42 and the transparent electrode 41 while the display device 1c displays the images. In other words, the green light L2 is continuously emitted from the fourth panel unit 26d while the display device is displays the images.

A voltage is applied between the transparent electrode and the electrode 25a and between the transparent electrode 42 and the electrode 25b to emit the white light from the portions of the region 15b and the region 16b of the display device 1c. Then, because the red light L3 is emitted from the fifth panel unit 26e, the red light L3 and the green light L2 emitted from the fourth panel unit 26d become white light by mixing. Therefore, white light can be emitted from the portions of the region 15b and the region 16b of the display device 1c.

The application of the voltage between the transparent electrode 42 and the electrode 25a and between the transparent electrode 42 and the electrode 25b is stopped to emit the green light L2 from the portions of the region 15b and the region 16b of the display device 1c. Then, only the green light L2 emitted from the fourth panel unit 26d can be emitted from the portions of the region 15b and the region 16b of the display device 1c.

In such a case, the electrode 25a is electrically independent from the electrode 25b. Therefore, the emission of the green light L2 and the emission of the white light can be controlled independently for the portions of the region 15b and the region 16b of the display device 1c.

Fifth Embodiment

Figure 8:
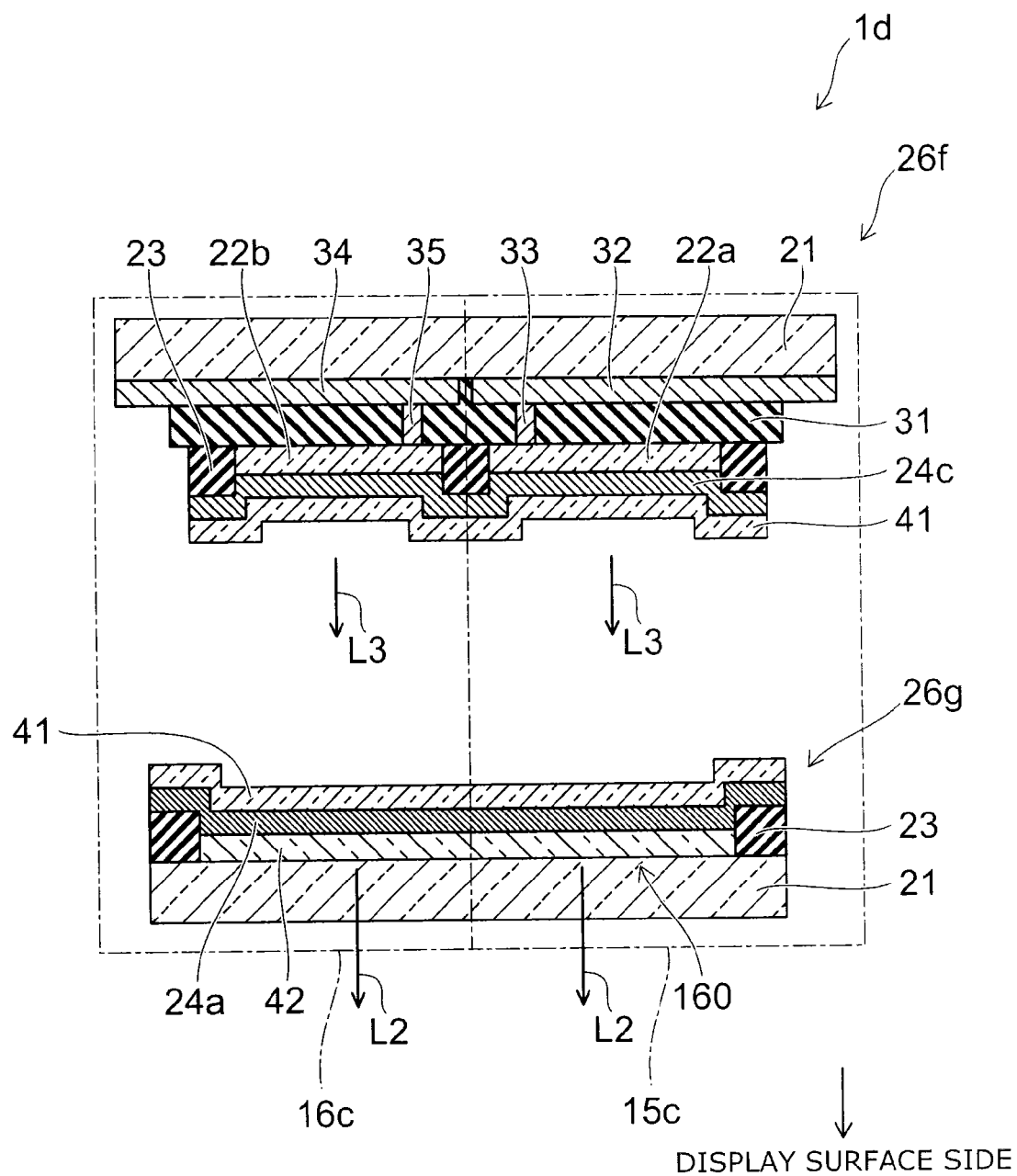
FIG. 8 is a schematic cross-sectional view showing a display device 1d according to a fifth embodiment.
Figure 9A:
FIGS. 9A to 9H are schematic views showing images according to other embodiments.
Figure 9B:
Figure 9C:
Figure 9D:
Figure 9E:
Figure 9F:
Figure 9G:
Figure 9H:
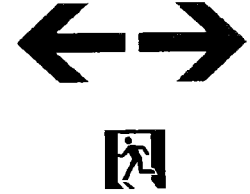

FIG. 8 is a schematic cross-sectional view showing a display device 1d according to a fifth embodiment.

In FIG. 8, two regions 15c and 16c that are provided in the display device 1d are shown for easier viewing of the drawing. The regions 15c and 16c may be, for example, regions of one selected from the segment 11, the segment 12, the segment 13, and the segment 14 described above.

In the display device 1d as shown in FIG. 8, a sixth panel unit 26g and a seventh panel unit 26f are provided to be stacked. The sixth panel unit 26g is provided on the display surface side, i.e., the light-emitting side, of the seventh panel unit 26f. The sixth panel unit 26g and the seventh panel unit 26f may be separated from each other or may be closely adhered.

The portion that includes the electrode 32 described below is the region 15c; and the portion that includes the electrode 34 described below is the region 16c.

The sixth panel unit 26g is the same as the fourth panel unit 26d described above.

The portion of the seventh panel unit 26f corresponding to the region 15c includes the substrate 21, the electrode 32, the contact plug 33, the insulating unit 31, the transparent electrode 22a, the organic light emitting layer 24c, and the transparent electrode 41. If necessary, the portion corresponding to the region 15c and the portion corresponding to the region 16c may further include the not-shown first functional layer and the not-shown second functional layer that are described above.

In other words, the substrate 21, the organic light emitting layer 24c, the insulating unit 31, and the transparent electrode 41 are provided commonly for the portion corresponding to the region 15c and the portion corresponding to the region 16c. The forms of the substrate 21, the organic light emitting layer 24c, the insulating unit 32, and the transparent electrode 41 have planar configurations.

The insulating unit 23 is provided at a predetermined position of the outlines of the images.

The electrode 32 and the transparent electrode 22a are electrically connected via the contact plug 33. The electrode 32, the contact plug 33, and the electrode 22a function as anodes of the region 15c.

The electrode 34 and the transparent electrode 22b are electrically connected via the contact plug 35. The electrode 34, the contact plug 35, and the electrode 22b function as anodes of the region 16c.

As long as the materials of the electrode 32, the contact plug 33, the electrode 34, and the contact plug 35 are electrically conductive and reflective, these materials are not particularly limited. The materials of the electrode 32, the contact plug 33, the electrode 34, and the contact plug 35 may be similar to, for example, the material of the electrode 25 described above.

As long as the insulating unit 31 is insulative and transparent, the insulating unit 31 is not particularly limited. The insulating unit 31 is provided between the electrode 32 and the transparent electrode 22a and between the electrode 34 and the transparent electrode 22b.

The material of the insulating unit 31 is, for example, silicon oxide, etc.

In the embodiment, similarly to the fourth embodiment, it is unnecessary to form the electrode 32, the contact plug 33, the electrode 34, and the contact plug 35 from materials that are transparent because these components are on the side (the side opposite to the display side) of the display device 1d from which these components are not easily visible. Therefore, it is possible to form, for example, the electrode 32, the contact plug 33, the electrode 34, and the contact plug 35 from a metal such as aluminum, etc., that has a lower electrical resistance than indium tin oxide. If the electrode 32, the contact plug 33, the electrode 34, and the contact plug 35 are formed from a metal such as aluminum, etc., the fluctuation of the luminance between the regions, etc., can be suppressed because the potential drop can be suppressed. In the example, the electrode 32, the contact plug 33, the electrode 34, the contact plug 35, and the insulating unit 31 are made before the organic light emitting layer 24c and can be made by a method other than a vacuum evaporation method. Therefore, the making of the display device 1d is easier.

The embodiment differs from the fourth embodiment in that the emission direction of the light of the seventh panel unit 26f is in the direction opposite to the direction toward the substrate 21. This is because the transparent electrode 41 is on the cathode side, and the transparent electrodes 22 and the electrode 32 that is reflective are on the anode side. Such a structure in which the emission direction of the light is the direction opposite to the substrate side is called a top-emission structure.

The effects of the display device 1d may be similar to those of the display device 1c shown in FIG. 7.

Embodiments are illustrated hereinabove. However, the invention is not limited to these descriptions.

For example, the images that are displayed are not limited to those shown in FIGS. 1B and 1C.

FIGS. 9A to 9H are schematic views showing images according to other embodiments.

Various images such as those shown in FIGS. 9A to 9H can be displayed.

The images illustrated hereinabove are examples and are not limited thereto.

The images may be modified appropriately according to the application of the display device, etc.

The synthesis of white light is not limited to the combination of green light and red light. The green light may be light of a mixed color of green light and blue light according to the chromaticities of the green light and the white light that are necessary.

The light emission color is not limited to white, green, or red and may be modified appropriately according to the application of the display device, etc. The light emission color may be changed by the type of the light emitting dopants, the combination of multiple types of light emitting dopants, the addition ratio of the multiple types of light emitting dopants, etc.

Applications of the display device according to the embodiment of the invention are not limited to illuminated emergency exit signs. The display device according to the embodiment may be widely used in display devices that display predetermined images.

Also, a display device 100 may be formed from multiple display units 2 and the control unit 3 that causes the display units 2 to selectively display the images.

Figure 10:
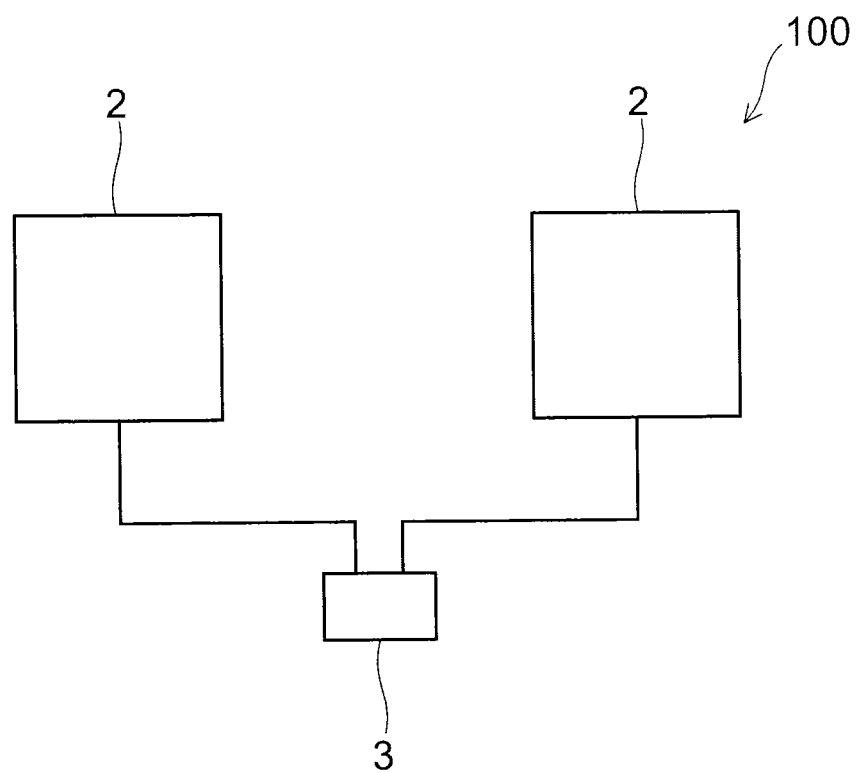
FIG. 10 is a schematic view showing a display device 100.

FIG. 10 is a schematic view showing the display device 100.

The display units 2 controlled by the control unit 3 may display the same image or may display different images.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device, comprising:
   a display unit having a plurality of segments, each of the plurality of segments including a plurality of organic light emitting layers to emit light of mutually different colors, the plurality of segments forming one of a plurality of types of images by changing the colors of the emitted light from the plurality of segments; and
   a control unit driving each of the plurality of segments of the display unit to emit light,
   wherein two of the plurality of segments are arranged in a first direction,
   each of the two segments includes a first organic light emitting layer emitting light of a first color and a second organic light emitting layer emitting light of a second color different from the first color, and
   the first organic light emitting layer and the second organic light emitting layer are stacked in the second direction crossing the first direction.

2. The device according to claim 1, wherein the control unit controls the color of the emitted light for each of the plurality of segments by selecting the color of the light emitted from at least one selected from the first organic light emitting layer and the second organic light emitting layer.

3. The device according to claim 1, wherein the control unit is capable of switching each of the segments between a first state in which light is emitted from one selected from the first organic light emitting layer and the second organic light emitting layer and a second state in which light is emitted from both the first organic light emitting layer and the second organic light emitting layer.

4. The device according to claim 1, wherein each of the plurality of segments has a plurality of regions separated in a plane.

5. The device according to claim 4, wherein the color of synchronously emitted light changes for the plurality of regions belonging to the same segment.

6. The device according to claim 1, wherein the first organic light emitting layer and the second organic light emitting layer have planar configurations.

7. The device according to claim 1, wherein the light of the second color emitted from the second organic light emitting layer passes through the first organic light emitting layer.

8. The device according to claim 1, further comprising a transparent electrode provided on the display surface side of the first organic light emitting layer, and an interconnect unit electrically connected to the transparent electrode, the interconnect unit being transmissive to the light.

9. The device according to claim 1, further comprising an electrode provided on a side of the second organic light emitting layer opposite to the display surface side, and an interconnect unit electrically connected to the electrode.

10. The device according to claim 1, further comprising:
a transparent electrode provided on the display surface side of the second organic light emitting layer;
a substrate provided on a side of the second organic light emitting layer opposite to the display surface side to face the transparent electrode;
an electrode provided between the second organic light emitting layer and the substrate; and
an interconnect unit provided between the substrate and the electrode, the interconnect unit being electrically connected to the electrode.

11. The device according to claim 1, wherein
each of the plurality of segments includes a first organic light emitting layer emitting light of a first color and a second organic light emitting layer emitting light of a second color different from the first color, and
the first organic light emitting layer and the second organic light emitting layer are stacked.

12. The device according to claim 11, wherein the control unit is controls the color of the emitted light for each of the plurality of segments by selecting the color of the light emitted from at least one selected from the first organic light emitting layer and the second organic light emitting layer.

13. The device according to claim 11, wherein the control unit is capable of switching each of the segments between a first state in which light is emitted from one selected from the first organic light emitting layer and the second organic light emitting layer and a second state in which light is emitted from both the first organic light emitting layer and the second organic light emitting layer.

14. The device according to claim 11, wherein each of the plurality of segments has a plurality of regions separated in a plane.

15. The device according to claim 14, wherein the color of synchronously emitted light changes for the plurality of regions belonging to the same segment.

16. The device according to claim 11, wherein the first organic light emitting layer and the second organic light emitting layer have line configurations.

17. The device according to claim 11, further comprising a transparent electrode provided on the display surface side of the first organic light emitting layer, and an interconnect unit electrically connected to the transparent electrode, the interconnect unit being transmissive to the light.

18. The device according to claim 11, further comprising an electrode provided on a side of the second organic light emitting layer opposite to the display surface side, and an interconnect unit electrically connected to the electrode.

19. The device according to claim 1 comprising a plurality of the display units,
wherein the control unit driving each of the plurality of the display units to form one of the plurality types of the images.

20. A display device, comprising:
a display unit including
a first segment, and
a second segment, the second segment being arranged with the first segment in a first direction,
the first segment including a first organic light emitting layer to emit a first light having a first color and a second organic light emitting layer to emit a second light having a second color different from the first color, the second organic light emitting layer overlapping the first organic light emitting layer in a second direction crossing the first direction, the first light passing through the second organic light emitting layer,
the second segment including a third organic light emitting layer to emit a third light having a third color and a fourth organic light emitting layer to emit a fourth light having a fourth color different from the third color, the fourth organic light emitting layer overlapping the third organic light emitting layer in the second direction, the third light passing through the fourth organic light emitting layer; and
a control unit to control the first to fourth organic light emitting layers.

21. The device according to claim 20, wherein
a first combination of emission of at least one of the first to fourth organic light emitting layers forms a first display image, and
a second combination of emission of at least one of the first to fourth organic light emitting layers forms a second display different from the first display, the second combination is different from the first combination.

* * * * *